(12) United States Patent
Suzuki

(10) Patent No.: US 8,378,713 B2
(45) Date of Patent: Feb. 19, 2013

(54) DIGITAL FILTER CIRCUIT

(75) Inventor: Yoshihide Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,087

(22) Filed: Sep. 15, 2011

(65) Prior Publication Data

US 2012/0200316 A1 Aug. 9, 2012

(30) Foreign Application Priority Data

Feb. 3, 2011 (JP) ................................ 2011-021427

(51) Int. Cl.
*G06F 7/50* (2006.01)
(52) U.S. Cl. ........... 326/52; 341/155; 341/166; 327/141
(58) Field of Classification Search .................... 326/52, 326/93–96, 104–105; 327/141–145; 341/166, 341/155; 708/300, 301, 313, 316, 319
See application file for complete search history.

(56) References Cited

U.S. PATENT DOCUMENTS

| 6,823,029 B1* | 11/2004 | Chapman et al. ............. 375/354 |
| 6,956,516 B2* | 10/2005 | Furuichi ....................... 341/155 |
| 7,348,915 B2 | 3/2008 | Leonard et al. |
| 7,990,304 B2* | 8/2011 | Lim et al. ...................... 341/164 |
| 2009/0313313 A1* | 12/2009 | Yokokawa et al. ........... 708/300 |

FOREIGN PATENT DOCUMENTS

JP 2006-067550 3/2006

OTHER PUBLICATIONS

Jung, et al. 2001. A low power FIR filter design for image processing. *VLSI Design*, 12(3):391-397.

* cited by examiner

*Primary Examiner* — Shawki Ismail
*Assistant Examiner* — Christopher Lo
(74) *Attorney, Agent, or Firm* — Knobbe, Martens, Olson & Bear LLP

(57) ABSTRACT

According to one embodiment, a digital filter circuit includes an EXOR circuit, a clock gating circuit, a reset control circuit, a counter, a filter time setting circuit, a comparator, and a decoder. The clock gating circuit outputs a clock gating signal. The reset control circuit generates a first signal. The counter generates a count signal. The filter time setting circuit latches the count signal when the first signal is in the enable state, and outputs a latched count value as a second signal. The comparator receives the count signal and the second signal, and outputs a third signal of the enable state when the value of the count signal and the value of the second signal match each other.

16 Claims, 8 Drawing Sheets

| IN1 | IN2 | IN3 | OUT |
|---|---|---|---|
| "Low" | "Low" | "Low" | "Low" |
| "Low" | "Low" | "High" | "Low" |
| "Low" | "High" | "Low" | "Low" |
| "Low" | "High" | "High" | "High" |
| "High" | "Low" | "Low" | "High" |
| "High" | "Low" | "High" | "Low" |
| "High" | "High" | "Low" | "High" |
| EXCEPT FOR THOSE MENTIONED ABOVE | | | "Low" |

FIG. 2

DIGITAL FILTER CIRCUIT

CROSS REFERENCE TO RELATED APPLICATION

This application is based upon and claims the benefit of priority from the prior Japanese Patent Application No. 2011-21427, filed on Feb. 3, 2011, the entire contents of which are incorporated herein by reference.

FIELD

Embodiments described herein relate to a digital filter circuit.

BACKGROUND

With the progress of digitalization of electronic devices for commercial and industrial uses, digital filter circuits are used in various fields. A digital filter circuit can easily achieve performance characteristics which it is difficult for an analog filter circuit to achieve.

The digital filter circuit needs a control circuit to perform digital filtering processing for a desired time period after receiving an input signal. Accordingly, there is a problem that the circuit is large in scale. Moreover, there is another problem that the power consumption is large since the digital filter circuit uses many counters and flip-flops.

BRIEF DESCRIPTION OF THE DRAWINGS

FIG. 2 is a view showing a truth table of a decoder of the first embodiment;

DETAILED DESCRIPTION

Figure 1:
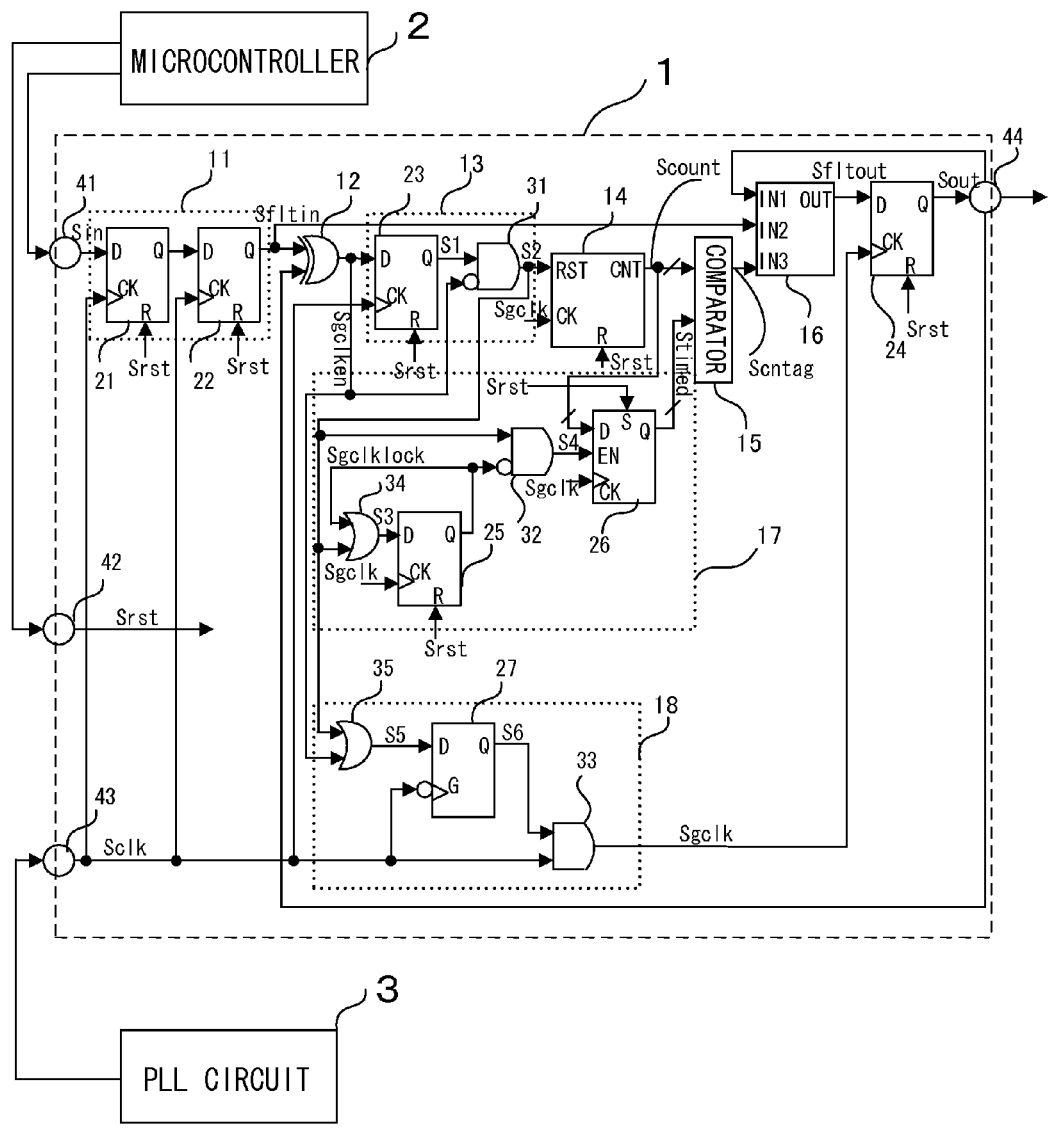
FIG. 1 is a circuit diagram showing a configuration of a digital filter circuit of a first embodiment.

According to one embodiment, a digital filter circuit includes an EXOR circuit, a clock gating circuit, a reset control circuit, a counter, a filter time setting circuit, a comparator, and a decoder. The EXOR circuit receives an input signal and a feedback-inputted output signal, and generates a clock gating enable signal of an enable state once receiving the output signal and the input signal having a phase reverse to that of the output signal. The clock gating circuit receives a clock signal and the clock gating enable signal, and captures and outputs the clock signal as a clock gating signal while the clock gating enable signal is in the enable state. The reset control circuit receives the clock signal and the clock gating enable signal, and generates a first signal of the enable state once the clock gating enable signal changes from the enable state to a disable state. The counter receives the first signal and the clock gating signal, is synchronously reset when the first signal is in the enable state, and performs a count operation to generate a count signal once receiving the clock gating signal while the first signal is in the disable state. The filter time setting circuit receives the first signal, the clock gating signal, and the count signal, and latches the count signal when the first signal is in the enable state, and outputs a latched count value as a second signal. The comparator receives the count signal and the second signal, and outputs a third signal of the enable state when the value of the count signal and the value of the second signal match each other. The decoder receives the feedback-inputted output signal, the first signal, and the third signal, and generates a fourth signal resulting from decode processing.

Hereinafter, further plural examples are described with reference to the drawings. In the drawings, the same or similar portions are denoted with the same reference numerals.

A digital filter circuit of the first embodiment will be described while referring to the drawings. FIG. 1 is a circuit diagram showing the configuration of the digital filter circuit. FIG. 2 shows a truth table of a decoder. In the embodiment, a control circuit to change a filtering time is not required, and thus the circuit configuration is simplified.

As shown in FIG. 1, a digital filter circuit 1 is provided with a sampling circuit 11, an EXOR circuit 12, a reset control circuit 13, a counter 14, a comparator 15, a decoder 16, a filter time setting circuit 17, a clock gating circuit 18, a flip-flop 24, and terminals 41 to 44.

The digital filter circuit 1 is used for analog-digital mixed LSIs, systems on a chip (SoCs), and the like for commercial and industrial uses. Here, the digital filter circuit 1 is used for in-vehicle use.

An input signal Sin, which is a filter input signal outputted from a microcontroller 2, is inputted into the terminal 41 serving as an input terminal. A reset signal Srst outputted from the microcontroller 2 is inputted into the terminal 42 serving as a reset terminal. A clock signal Sclk outputted from a PLL circuit 3 is inputted into the terminal 43 serving as a clock terminal. An output signal Sout outputted from the flip-flop 24 serving as a storage circuit is inputted into the terminal 44 serving as an output terminal. The output signal Sout is feedback-inputted into the EXOR circuit 12 and the decoder 16. In this respect, the microcontroller 2 generates the input signal Sin and the reset signal Srst. Instead, however, a central processing unit (CPU) or a digital signal processor (DSP) may generate the signals.

The digital filter circuit 1 has a structure that enables the digital filter circuit 1 to set up an arbitrary filtering time by using the first high-level pulse duration of the input signal Sin which the digital filter circuit 1 receives via the terminal 41 after reset cancellation. After setting up the filtering time, the digital filter circuit 1 receives the input signal Sin outputted from the microcontroller 2. The digital filter circuit 1 outputs a high-level signal when the high-level signal continues for a certain length of time, and outputs a low-level signal when the low-level signal continues for a certain length of time.

In a case where the received input signal Sin is at a high level or a low level, the digital filter circuit 1 keeps the output from the terminal 44, which is the output terminal, in a previous state until the arbitrarily-set time period elapses. The digital filter circuit 1 operates only when the function is needed, and stops the supply of clocks when the function is not needed.

Accordingly, a signal (enable signal) to operate the digital filter circuit 1 from the outside is not needed. No dedicated control circuit is needed in a logic circuit. In addition, neither a dedicated GPIO terminal for the microcontroller 2 nor the like is needed. The digital filter circuit 1 can further inhibit the increase in the circuit scale as the digital filter circuits are required for a larger number of channels, since the circuit configuration is simplified. The digital filter circuit 1 will be described in detail later.

The sampling circuit 11 is provided between the terminal 41 and the EXOR circuit 12. The sampling circuit 11 includes a flip-flop 21 and a flip-flop 22 which are connected together in series. The sampling circuit 11 is capable of dealing with a metastable state of the asynchronous input signal Sin within a range of one clock, and generates a signal Sfltin resulting from sampling processing. The metastable state generally does not continue beyond a range of one clock.

The flip-flop 21 receives the input signal Sin at a D port of the flip-flop 21, latches the data of the input signal Sin at a rising edge of the clock signal Sclk, and outputs the latched data from a Q port of the flip-flop 21. The flip-flop 21 receives the reset signal Srst at an R port of the flip-flop 21, and resets the data on the basis of the reset signal Srst.

The flip-flop 22 receives the output signal from the flip-flop 21 at a D port of the flip-flop 22. Then, the flip-flop 22 latches the data of the signal at the rising edge of the clock signal Sclk, and outputs the latched data as the signal Sfltin from a Q port of the flip-flop 22. The flip-flop 22 receives the reset signal Srst at an R port of the flip-flop 22, and resets the data on the basis of the reset signal Srst.

The EXOR circuit 12 is provided among the sampling circuit 11 and the reset control circuit 13. The EXOR circuit 12 is provided among the terminal 44 and the reset control circuit 13. Once receiving a signal Sfltin and the feedback-inputted output signal Sout, the EXOR circuit 12 outputs a signal, which is obtained by a logical operation, as a clock gating enable signal Sgclken. The EXOR circuit 12 generates the clock gating enable signal Sgclken of the low level (disable state) when the value of the signal Sfltin and the value of the output signal Sout is equal to each other. The equal value means that both of the signal Sfltin and the output signal Sout are at the high level (enable state) or at the low level (disable state). The EXOR circuit 12 generates the clock gating enable signal Sgclken of the high level (enable state) when the value of the signal Sfltin and the value of the output signal Sout are different from each other.

The reset control circuit 13 is provided between the EXOR circuit 12 and the counter 14. When the clock gating enable signal Sgclken outputted from the EXOR circuit 12 changes from the high level (enable state) to the low level (disable state), the reset control circuit 13 generates a signal S2 to synchronously reset the counter 14. The counter 14 is synchronously reset when the signal S2 is at the high level (enable state).

The reset control circuit 13 includes a flip-flop 23 and a two-input AND circuit 31. The flip-flop 23 receives the clock gating enable signal Sgclken at a D port of the flip-flop 23. Then, the flip-flop 23 latches the data of the signal at the rising edge of the clock signal Sclk, and outputs the latched data as a signal S1 from a Q port of the flip flop 23. Once receiving the reset signal Srst at an R port of the flip-flop 23, the lip-flop 23 resets the data on the basis of the reset signal Srst. Once receiving signal S1 and an inverted signal of the clock gating enable signal Sgclken, the two-input AND circuit 31 generates the signal S2 resulting from logical operation processing.

When the clock gating enable signal Sgclken outputted from the EXOR circuit 12 is at the high level (enable state), the clock gating circuit 18 captures the clock signal Sclk upon receiving the clock signal Sclk, and generates a clock gating signal Sgclk. When the clock gating enable signal Sgclken is at the low level (disable state), the clock gating signal Sgclk is at the low level (disable state).

The clock gating circuit 18 includes a two-input OR circuit 35, a latch circuit 27, and a two-input AND circuit 33. Once receiving the clock gating enable signal Sgclken and the signal S2, the two-input OR circuit 35 generates a signal S5 resulting from logical operation processing. The latch circuit 27 receives the signal S5 at a D port of the latch circuit 27, latches the data of the signal S5 at the falling edge of the clock signal Sclk, and outputs the latched data, as a signal S6, from a Q port of the latch circuit 27. Once receiving the signal S6 and the clock signal Sclk, the two-input AND circuit 33 generates the clock gating signal Sgclk resulting from logical operation processing.

The counter 14 is provided between the reset control circuit 13 and the comparator 15. The counter 14 receives the signal S2 at an RST port of the counter 14, receives the clock gating signal Sgclk at a CK port of the counter 14, and receives the reset signal Srst at an R port of the counter 14. Upon receiving the clock gating signal Sgclk as the clock outputted from the clock gating circuit 18, the counter 14 performs count operation, and outputs a count value as the count signal Scount. Once receiving the reset signal Srst at the R port of the counter 14, the counter 14 resets the data on the basis of the reset signal Srst.

When the signal S2 outputted from the reset control circuit 13 is at the high level (enable state), the filter time setting circuit 17 latches the count value of the count signal Scount outputted from the counter 14, and outputs the count value of the count signal Scount as a signal Stimed.

The filter time setting circuit 17 includes a two-input OR circuit 34, a flip-flop 25, a two-input AND circuit 32, and a set-enable flip-flop 26. Once receiving the signal S2 and a clock gating lock signal Sgclklock, which is a feedback-inputted output from the flip-flop 25, the two-input OR circuit 34 generates a signal S3 resulting from logical operation processing.

The flip-flop 25 receives the signal S3 is inputted into a D port of the flip-flop 25. Then, the flip-flop 25, latches the data of the signal at the rising edge of the clock gating signal Sgclk serving as the clock, and outputs the latched data as the clock gating lock signal Sgclklock from a Q port of the flip-flop 25. Once receiving the reset signal Srst at an R port of the flip-flop 25, the flip-flop 25 resets the data on the basis of the reset signal Srst.

Once receiving the signal S2 and an inverted signal of the clock gating lock signal Sgclklock, the two-input AND circuit 32 generates a signal S4 resulting from logical operation processing. The set-enable flip-flop 26 receives the count signal Scount at a D port of the set-enable flip-flop 26, and receives the signal S4 at an EN port of the set-enable flip-flop 26. When the signal S4 is at the high level (enable state), the set-enable flip-flop 26 latches the count value of the count signal Scount on the basis of the clock gating signal Sgclk serving as the clock, and outputs the latched data as the signal Stimed. The set-enable flip-flop 26 receives the reset signal Srst at an S port of the set-enable flip-flop 26.

The comparator 15 is provided among the counter 14 and the decoder 16. The comparator 15 is provided among the filter time setting circuit 17 and the decoder 16. The comparator 15 receives the count signal Scount and the signal Stimed. When the value of the count signal Scount matches the value of the signal Stimed, the comparator 15 outputs a signal Scntag of the high level (enable state). When the value of the count signal Scount is different from the value of the signal Stimed, the comparator 15 outputs the signal Scntag of the low level (disable state).

The decoder 16 receives the feedback-inputted output signal Sout at an IN1 port of the decoder 16, receives the signal Sfltin at an IN2 port of the decoder 16, receives the signal Scntag at an IN3 port of the decoder 16, and performs decoding processing, and outputs a signal Sfltout from an OUT port of the decoder 16.

Specifically, as shown in FIG. 2, the decoder 16 outputs a low-level signal from the OUT port, when the signal inputted into the IN1 port is at the low level, the signal inputted into the IN2 port is at the low level, and the signal inputted into the IN3 port is at the low level. The decoder 16 outputs a low-level signal from the OUT port, when the signal inputted into the IN1 port is at the low level, the signal inputted into the IN2 port is at the low level, and the signal inputted into the IN3 port is at the high level. The decoder 16 outputs a low-level signal from the OUT port, when the signal inputted into the IN1 port is at the low level, the signal inputted into the IN2 port is at the high level, and the signal inputted into the IN3 port is at the low level. The decoder 16 outputs a high-level signal from the OUT port, when the signal inputted into the IN1 port is at the low level, the signal inputted into the IN2 port is at the high level, and the signal inputted into the IN3 port is at the high level. The decoder 16 outputs a high-level signal from the OUT port, when the signal inputted into the IN1 port is at the high level, the signal inputted into the IN2 port is at the low level, and the signal inputted into the IN3 port is at the low level. The decoder 16 outputs a low-level signal from the OUT port, when the signal inputted into the IN1 port is at the high level, the signal inputted into the IN2 port is at the low level, and the signal inputted into the IN3 port is at the high level. The decoder 16 outputs a high-level signal from the OUT port, when the signal inputted into the IN1 port is at the high level, the signal inputted into the IN2 port is at the high level, and the signal inputted into the IN3 port is at the low level. The decoder 16 outputs a low-level signal from the OUT port when signals other than those mentioned above are inputted into the IN1 port, the IN2 port and the IN3 port, respectively.

The flip-flop 24 is provided among the decoder 16 and the terminal 44, is provided among the clock gating circuit 18 and the terminal 44, and functions as a storage circuit. The flip-flop 24 receives the signal Sfltout at a D port of the flip-flop 24. Subsequently, the flip-flop 24 latches the data of the signal at the rising edge of the clock gating signal Sgclk, and outputs the latched data from a Q port of the flip-flop 24. Once receiving the reset signal Srst at an R port of the flip-flop 24, the flip-flop 24 resets the data on the basis of the reset signal Srst.

Figure 3:
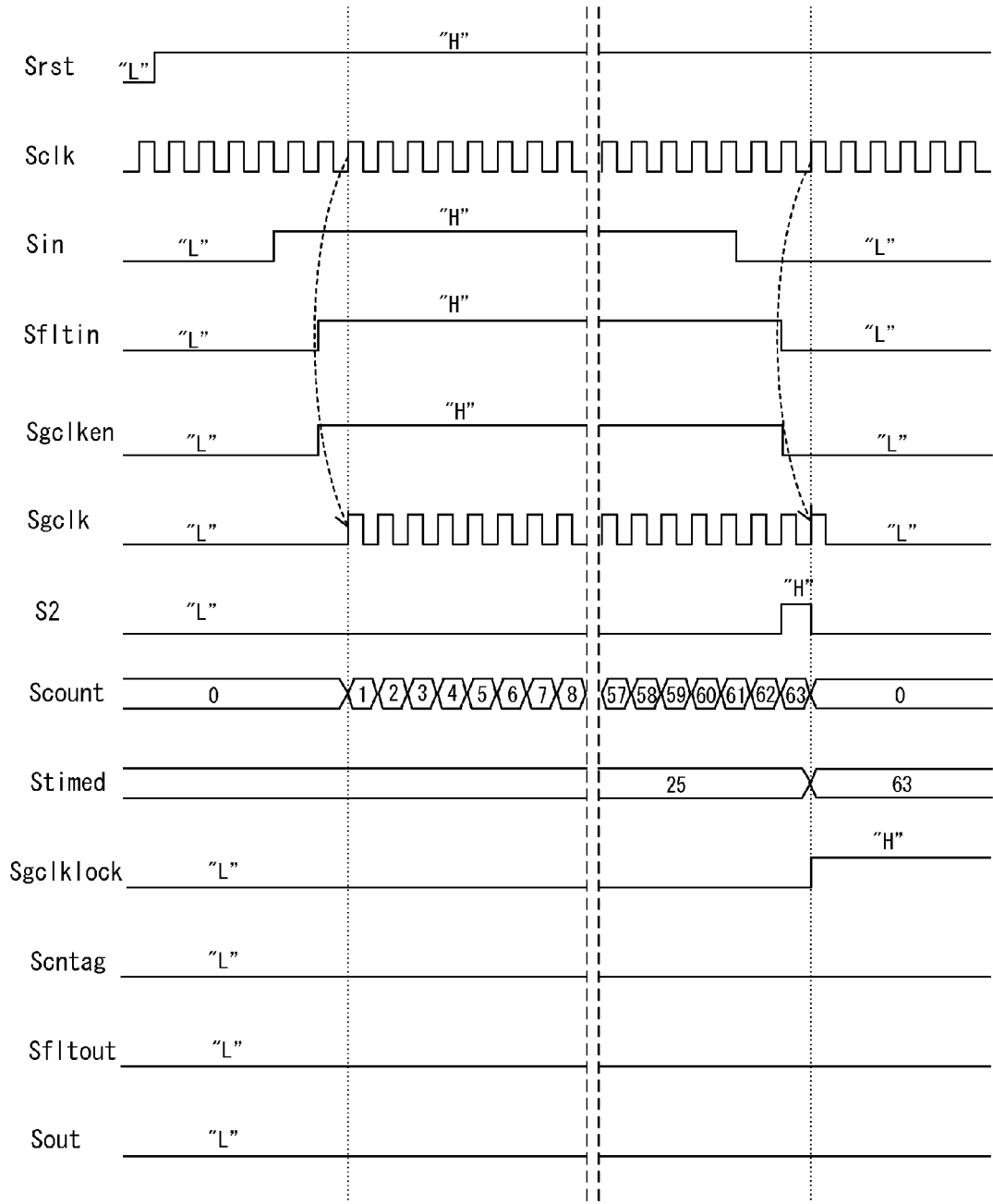
FIG. 3 is a timing chart showing an operation of the digital filter circuit of the first embodiment.

Next, the operation of the digital filter circuit will be described while referring to FIGS. 3 to 6. FIG. 3 is a timing chart showing how the filtering time is set up after the reset cancellation.

As shown in FIG. 3, in the initial state, the output from each of the circuits constituting the digital filter circuit 1 is set at the low level, except for the output from the filter time setting circuit 17. In the initial state of the filter time setting circuit 17, all the bits are set at the high level. This is because the filtering time is designed to be determined after the reset cancellation.

First, the reset signal Srst, which is inputted from the microcontroller 2 via the terminal 42 being the reset terminal, is changed from the low level to the high level. Thereby, the reset is cancelled. Thereafter, the asynchronous input signal Sin is inputted into the sampling circuit 11 from the microcontroller 2 via the terminal 41 being the input terminal. The sampling circuit 11 generates the signal Sfltin which is a sampling signal obtained by: subjecting the input signal Sin to anti-metastable measures on the basis of the clock signal Sclk; and subjecting the resultant input signal Sin to the sampling processing.

The clock gating enable signal Sgclken outputted from the EXOR circuit 12 is kept at the low level (disable state) while the signal Sfltin and the feedback-inputted output signal Sout take on the same value (at the low level in this case). The counter 14 receives the clock gating signal Sgclk of the low level, and halts the counting operation.

Next, once the signal Sfltin changes from the low level to the high level and the value of the signal Sfltin becomes different from the value of the feedback-inputted output signal Sout, the clock gating enable signal Sgclken outputted from the EXOR circuit 12 changes to the high level (enable state). The values being different from each other means that the signal Sfltin is at the high level and the output signal Sout is at the low level. The counter 14 receives the clock gating signal Sgclk serving as the clock, and starts the count operation.

Next, once the input signal Sin having a high-level duration corresponding to a desired filtering time changes from the high level to the low level, the signal Sfltin being the sampling signal changes from the high level to the low level. Furthermore, the clock gating enable signal Sgclken outputted from the EXOR circuit 12 changes from the high level to the low level. At the timing when the signal S2 changes from the high level (enable state) to the low level (disable state), the count value at that time is latched by the filter time setting circuit 17. In this respect, let us assume that the value of the filtering time is 63. The count operation of the count signal Scount is halted by the signal S2 of the high level (enable state), and is initialized (set at zero). The clock gating lock signal Sgclklock changes from the low level to the high level.

In other words, the digital filter circuit 1 determines the desired filtering time only on the basis of the input signal Sin inputted from the terminal 41 being the input terminal.

The regular operation of the digital filter circuit 1 is performed hereafter. The filtering time is cleared by reset input.

Figure 4:
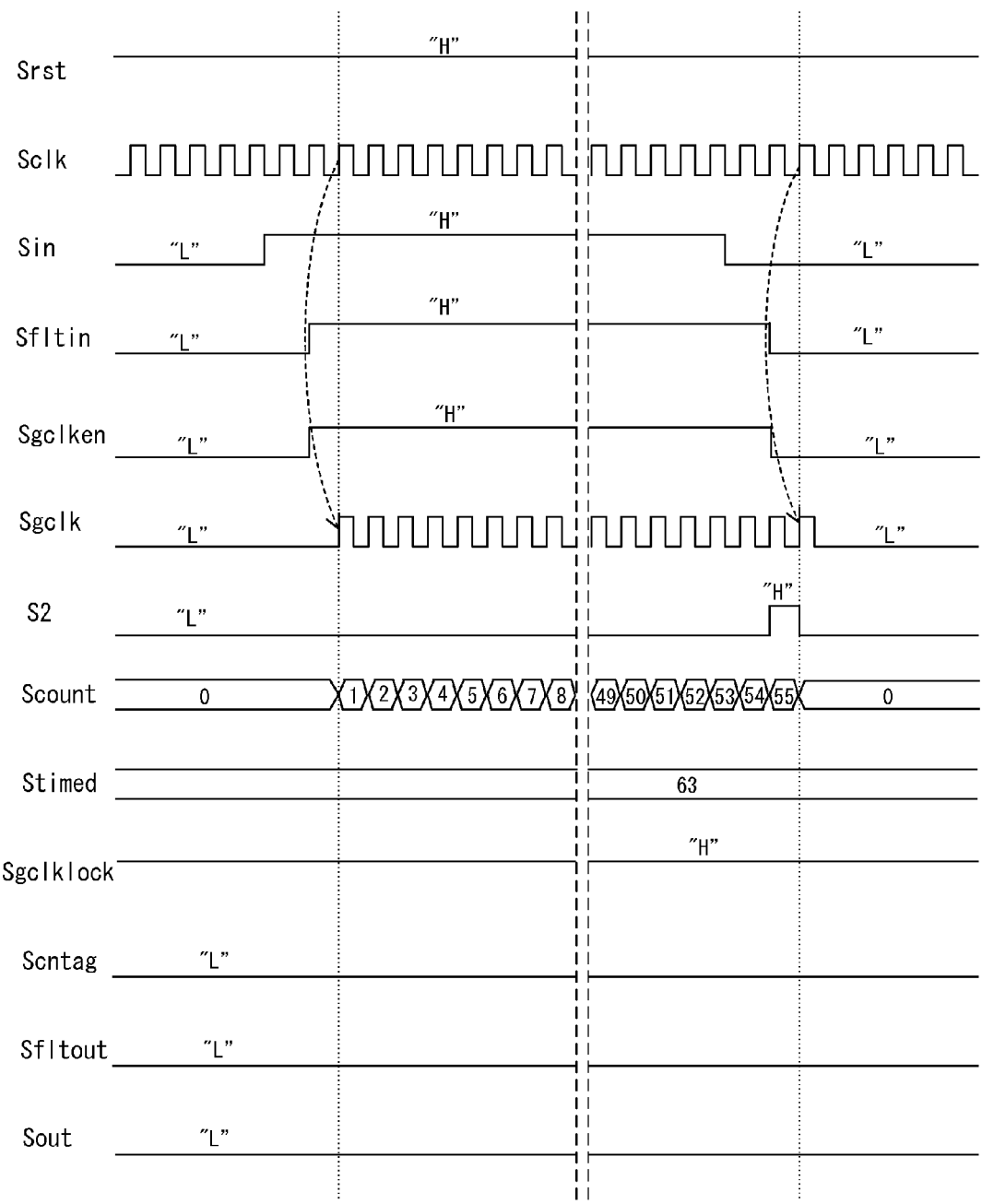
FIG. 4 is another timing chart showing the operation of the digital filter circuit of the first embodiment.

FIG. 4 is a timing chart applied to the case where the high-level period of the input signal does not match the filtering time. In this case, let us assume that the count value of the signal Stimed is set at 63 as the filtering time.

As shown in FIG. 4, once the input signal Sin having a high-level duration corresponding to a filtering time which is different from the filtering time shown in FIG. 3 changes from the high level to the low level, the signal Sfltin being the sampling signal changes from the high level to the low level. The clock gating enable signal Sgclken outputted from the EXOR circuit 12 changes from the high level (enable state) to the low level (disable state). The count operation of the count signal Scount is halted by the signal S2 of the high level (enable state), and is initialized. In this respect, let us assume that the count operation is halted at the count value of 55. Because the clock gating lock signal Sgclklock is kept at the low level, the count value of the signal Stimed remains unchanged. In this respect, the count value of 63 is maintained. Since the value of the count signal Scount does not match the value of the signal Stimed, the signal Scntag outputted from the comparator 15 remains unchanged at the low level, and the output signal Sout are remains unchanged at the low level.

Figure 5:
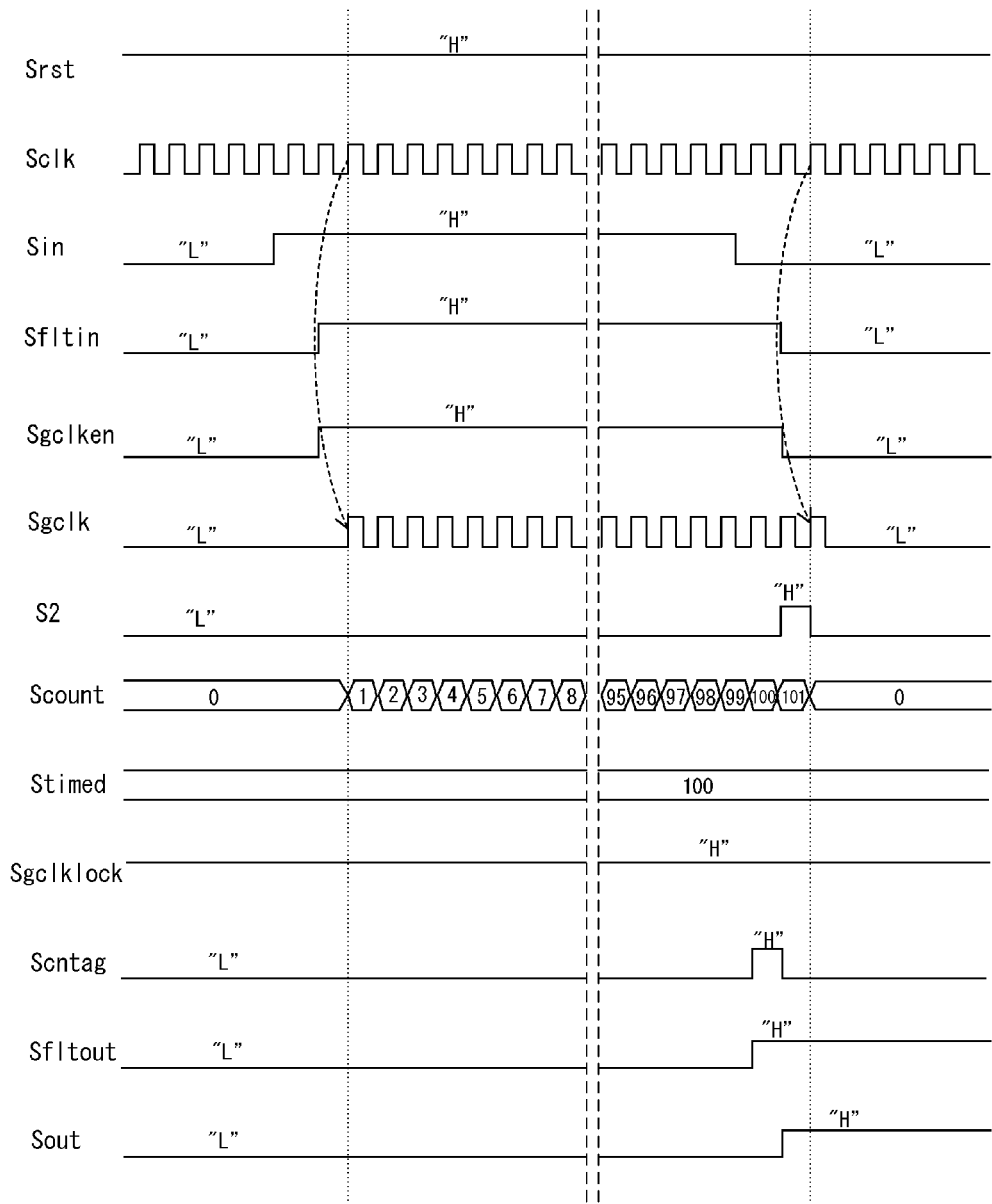
FIG. 5 is yet another timing chart showing the operation of the digital filter circuit of the first embodiment.

FIG. 5 is a timing chart applied to the case where the high level period of the input signal matches the filtering time. In this respect, let us assume that the count value of the signal Stimed is set at 100 as the filtering time.

As shown in FIG. 5, when the input signal Sin having a high level duration corresponding to a predetermined filtering time changes from the high level to the low level, the signal Sfltin being the sampling signal changes from the high level to the low level. The clock gating enable signal Sgclken outputted from the EXOR circuit 12 changes from the high level (enable state) to the low level (disable state). The count operation of the count signal Scount halts when the signal S2 is at the high level (enable state). In this case, the count operation halts at the count value of 101. Because the clock gating lock signal Sgclklock is kept at the low level, the count value of the signal Stimed remains unchanged. The count value of 100 is maintained.

When the value of the count signal Scount matches the value of the signal Stimed (when the count value is 100), the signal Scntag outputted from the comparator 15 changes from the low level (disable state) to the high level (enable state). After the value of the count signal Scount and the value of the signal Sfltout agree with each other, the signal Sfltout outputted from the decoder 16 changes from the low level to the high level. After the signal Scntag changes from the high level (enable state) to the low level (disable state), the output signal Sout outputted from the flip-flop 24 serving as the storage circuit changes from the low level to the high level on the basis of the clock gating signal Sgclk serving as the clock.

Figure 6:
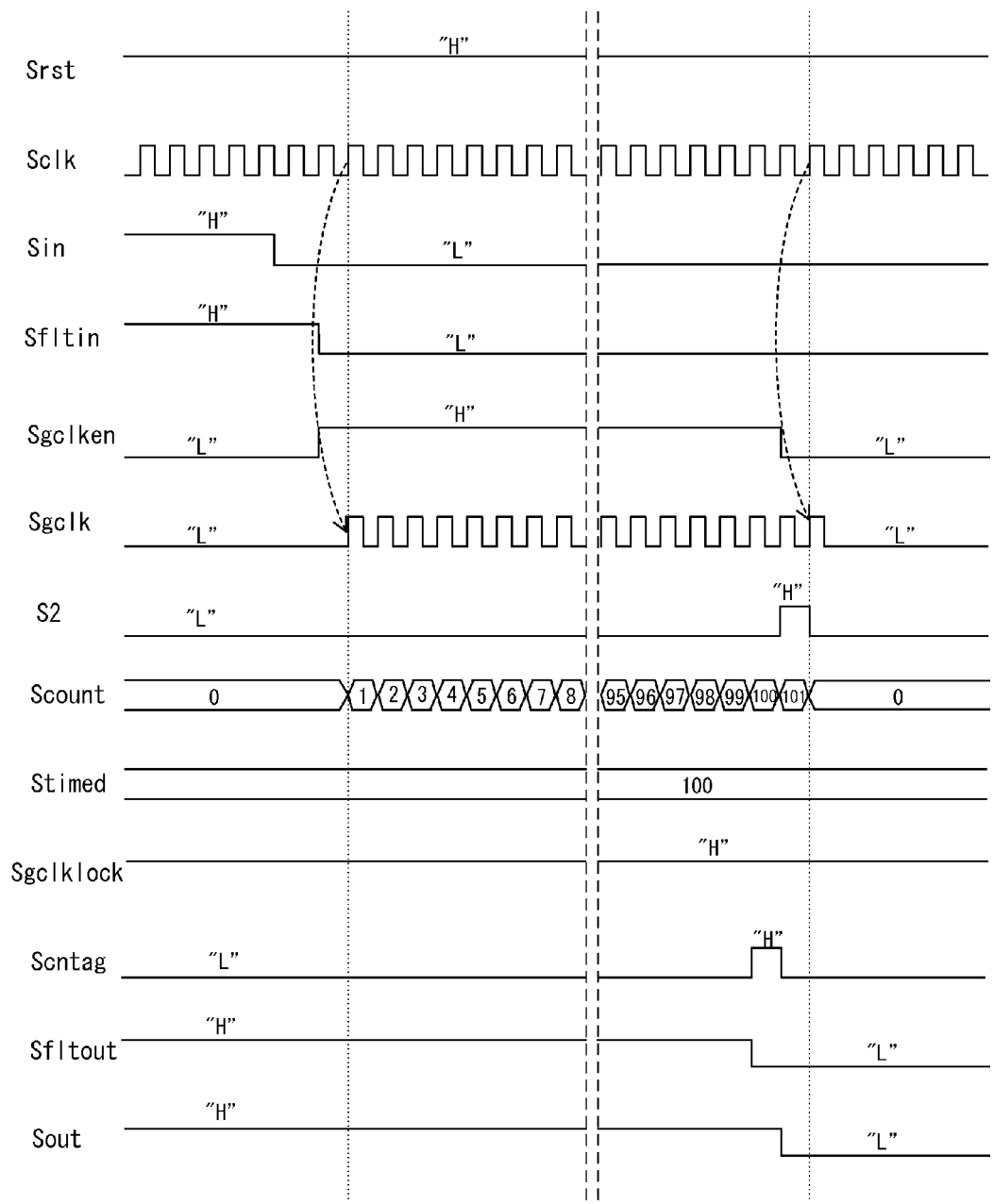
FIG. 6 is still another timing chart showing the operation of the digital filter circuit of the first embodiment.

FIG. 6 is a timing chart applied to the case where the input signal changes from the high level to the low level, and the signals inputted into to the comparator match each other. In this respect, let us assume that, as the filtering time, the count value of the signal Stimed is set at 100.

As shown in FIG. 6, first of all, the asynchronous input signal Sin inputted from the microcontroller 2 via the terminal 41 being the input terminal changes from the high level to the low level. At this time, the output signal Sout is kept at the high level. Once receiving the input signal Sin of the low level, the sampling circuit 11 generates the signal Sfltin of the low lever which is obtained by subjecting the input signal Sin to the anti-metastable measures based on the clock signal Sclk; and subjecting the resultant input signal Sin to the sampling processing.

The clock gating enable signal Sgclken outputted from the EXOR circuit 12 is kept at the low level (disable state) while the signal Sfltin and the feedback-inputted output signal Sout take on the same value (at the high level in this case). The counter 14 receives the clock gating signal Sgclk of the low level, and halts the counting operation.

Next, once the signal Sfltin changes from the high level to the low level and the value of the signal Sfltin becomes different from the value of the feedback-inputted output signal Sout, the clock gating enable signal Sgclken outputted from the EXOR circuit 12 changes to the high level (enable state). In this respect, the values being different from each other means that the signal Sfltin is at the low level and the output signal Sout is at the high level. The counter 14 receives the clock gating signal Sgclk serving as the clock, and starts the count operation.

Subsequently, once the count value of the count signal Scount matches the count value of the signal Stimed, the signal Scntag outputted from the comparator 15 changes from the low level (disable state) to the high level (enable state). After the signal Scntag changes from the low level (disable state) to the high level (enable state), the signal Sfltout outputted from the decoder 16 changes from the high level to the low level. The flip-flop 24 serving as the storage circuit latches the data of the signal Sfltout of the low level on the basis of the clock gating signal Sgclk being the clock, and outputs the output signal Sout of the low level.

Then, once receiving the feedback-inputted output signal Sout of the low level and the signal Sfltin of the low level, the EXOR circuit 12 generates the clock gating enable signal Sgclken of the low level (disable state). Once the reset control circuit 13 receives the clock gating enable signal Sgclken of the low level (disable state), the signal S2 outputted from the reset control circuit 13 changes from the low level (disable state) to the high level (enable state). While the signal S2 is at the high level (enable state), the count operation of the count signal Scount is halted, and is initialized (set at zero). Here, the count operation halts at the count value of 101.

It should be noted that the input signal Sin inputted via the terminal 41 changes from the high level to the low level while the output signal Sout outputted from the terminal 44 is at the high level, and that an operation similar to that in FIG. 5 is performed if the signals inputted into the comparator 15 do not match each other. However, the polarities of the input signal Sin, the signal Sfltin, the signal Sfltout and the output signal Sout are reverse to those in FIG. 5.

As described above, the digital filter circuit of the embodiment is provided with the sampling circuit 11, the EXOR circuit 12, the reset control circuit 13, the counter 14, the comparator 15, the decoder 16, the filter time setting circuit 17, the clock gating circuit 18, the flip-flop 24, and the terminals 41 to 44. The digital filter circuit 1 is configured to be capable of determining the arbitrary filtering time by using only the input signal inputted via the input terminal 41. The digital filter circuit 1 is configured to operate the counter 14, the filter time setting circuit 17, and the flip-flop 24 serving as the storage circuit only during the filtering operation on the basis of the clock gating signal Sgclk generated by the clock gating circuit 18.

Accordingly, no control circuit to change the filtering time is needed. Moreover, since the circuit configuration is simplified, increase in the circuit scale can be further inhibited as digital filter circuits are required for a larger number of channels. Moreover, since the digital filter circuit 1 is operated based on the clock gating signal Sgclk, the power consumption of the digital filter circuit 1 can be suppressed.

In the embodiment, the sampling circuit 11 is formed from the two flip-flops which are connected together in series. However, the sampling circuit 11 may be formed from n flip-flops (note that n is an integer equal to or larger than three). In this case, the metastable state can be avoided even when the metastable state exceeds the range of one clock.

Figure 7:
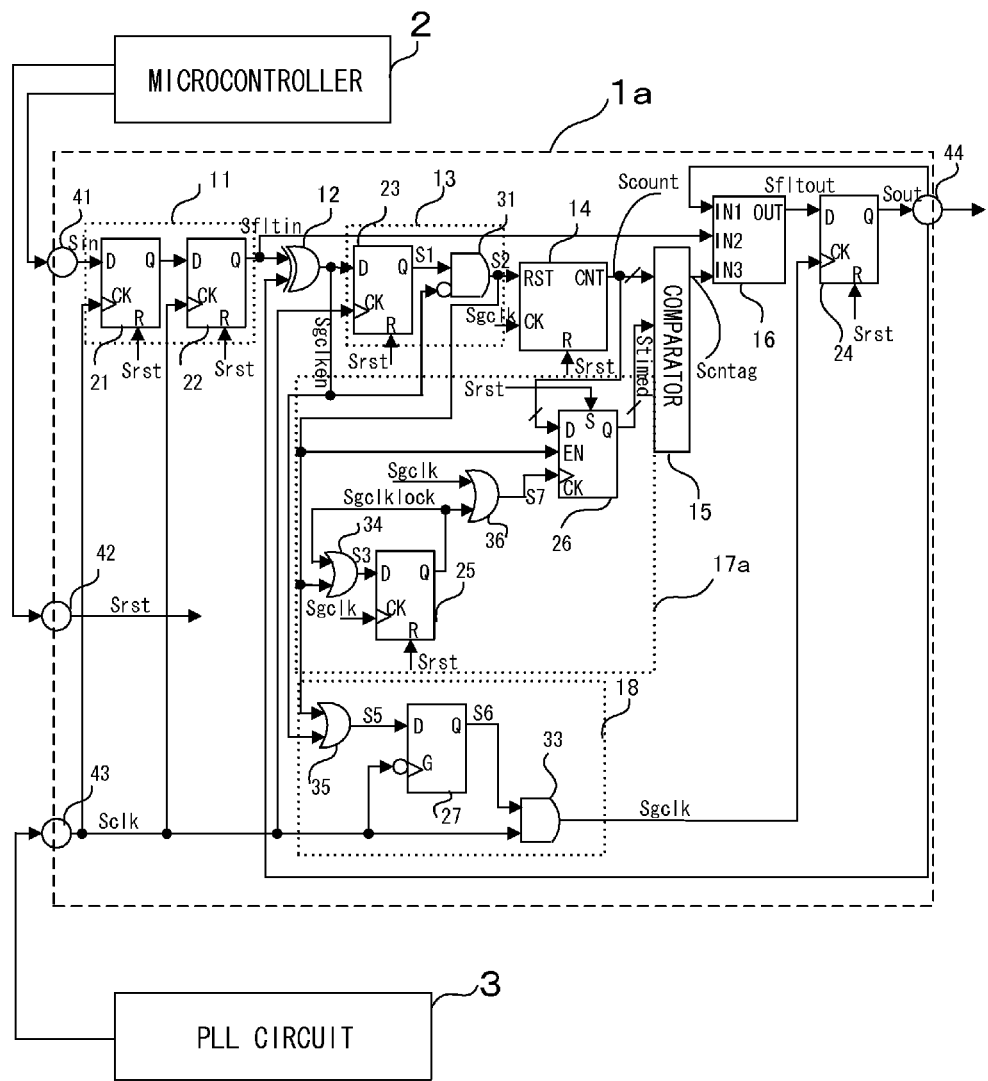
FIG. 7 is a circuit diagram showing a configuration of a digital filter circuit of a second embodiment.

A digital filter circuit of the second embodiment of the invention will be described while referring to the drawings. FIG. 7 is a view showing the configuration of the digital filter circuit. The embodiment is different in the configuration of a filter time setting circuit.

The same portions as those in the first embodiment will be hereinbelow denoted with the same reference numerals, and descriptions for such portions will be omitted. Only portions different from those of the first embodiment will be described.

As shown in FIG. 7, a digital filter circuit 1*a* is provided with a sampling circuit 11, an EXOR circuit 12, a reset control circuit 13, a counter 14, a comparator 15, a decoder 16, a filter time setting circuit 17*a*, a clock gating circuit 18, a flip-flop 24, and terminals 41 to 44.

The digital filter circuit 1*a* has a structure that enables the digital filter circuit 1*a* to set up an arbitrary filtering time by using the first high-level pulse duration of an input signal Sin inputted via the terminal 41 after reset cancellation.

The digital filter circuit 1*a* is different from the digital filter circuit 1 of the first embodiment only in the configuration of the filter time setting circuit 17*a*, and operates similarly. Thus, descriptions of the circuit operation are omitted.

The filter time setting circuit 17a includes a two-input OR circuit 34, a flip-flop 25, a two-input OR circuit 36, and a set-enable flip-flop 26. Once receiving the signal S2 and the clock gating lock signal Sgclklock, which is a feedback-inputted output from the flip-flop 25, the two-input OR circuit 34 generates the signal S3 resulting from logical operation processing.

The flip-flop 25 receives the signal S3 at the D port of the flip-flop 25, latches the data of the signal at the rising edge of the clock gating signal Sgclk serving as the clock, and outputs the latched data as the clock gating lock signal Sgclklock from the Q port of the flip-flop 25. Once receiving the reset signal Srst at the R port of the flip-flop 25, the flip-flop 25 resets the data on the basis of the reset signal Srst.

Once receiving the clock gating signal Sgclk and the clock gating lock signal Sgclklock, the two-input OR circuit 36 generates a signal S7 resulting from logical operation processing. The set-enable flip-flop 26 receives the count signal Scount at the D port of the set-enable flip-flop 26, and receives the signal S2 at the EN port of the set-enable flip-flop 26. When the signal S2 is at the high level (enable state), the set-enable flip-flop 26 latches the count value of the count signal Scount on the basis of the signal S7, and outputs the latched data as the signal Stimed.

As described above, the digital filter circuit of the embodiment is provided with the sampling circuit 11, the EXOR circuit 12, the reset control circuit 13, the counter 14, the comparator 15, the decoder 16, the filter time setting circuit 17a, the clock gating circuit 18, the flip-flop 24, and the terminals 41 to 44. The digital filter circuit 1a is configured to be capable of determining the arbitrary filtering time by using only the input signal inputted via the input terminal 41. The digital filter circuit 1a is configured to operate the counter 14, the filter time setting circuit 17a, and the flip-flop 24 serving as the storage circuit only during the filtering operation on the basis of the clock gating signal Sgclk generated by the clock gating circuit 18.

Accordingly, no control circuit to change the filtering time is needed. Moreover, since the circuit configuration is simplified, increase in the circuit scale can be further inhibited as digital filter circuits are required for a larger number of channels. Moreover, since the digital filter circuit 1a is operated based on the clock gating signal Sgclk, the power consumption of the digital filter circuit 1a can be suppressed.

Figure 8:
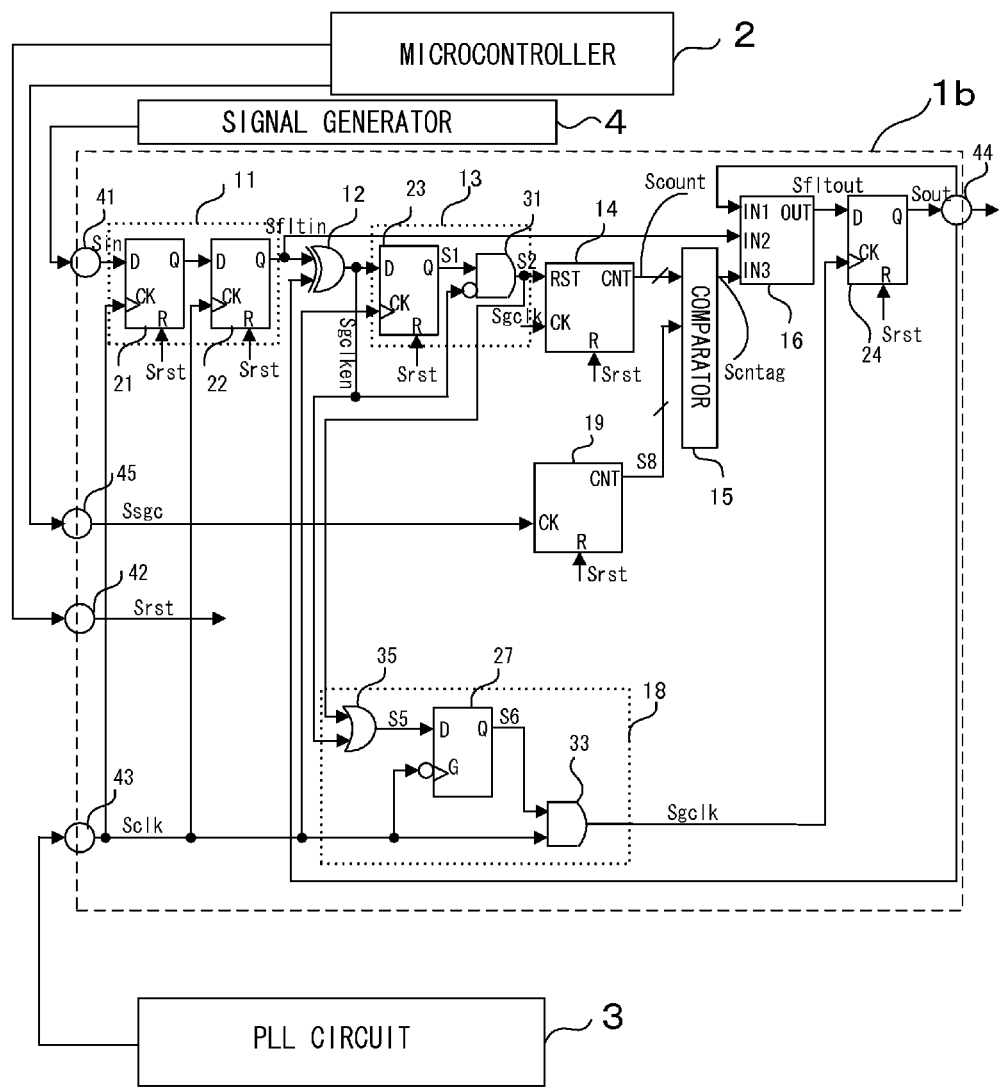
FIG. 8 is a circuit diagram showing a configuration of a digital filter circuit of a third embodiment.

A digital filter circuit of a third embodiment of the invention will be described while referring to the drawings. FIG. 8 is a circuit diagram showing the configuration of the digital filter circuit. The digital filter circuit of the embodiment is provided with a counter instead of the filter time setting circuit.

The same portions as those in the first embodiment will be hereinbelow denoted with the same reference numerals, and descriptions for such portions will be omitted. Only portions different from those of the first embodiment will be described.

As shown in FIG. 8, a digital filter circuit 1b is provided with a sampling circuit 11, an EXOR circuit 12, a reset control circuit 13, a counter 14, a comparator 15, a decoder 16, a clock gating circuit 18, a flip-flop 24, a counter 19, and terminals 41 to 44.

An input signal Sin, which is a filter input signal outputted from a signal generator 4, is inputted into the terminal 41 serving as an input terminal. The signal generator 4 converts an analog signal of a sound source to a digital signal, and outputs the analog-digital converted signal, as the input signal Sin, to the terminal 41, for example. A control signal Ssgc outputted from a microcontroller 2 is inputted into the terminal 45 serving as a control terminal. In this respect, the microcontroller 2 generates the control signal Ssgc and a reset signal Srst. Instead, however, a CPU, a DSP, or the like may generate the signals.

The digital filter circuit 1b has a structure that enables the digital filter circuit 1b to set up an arbitrary filtering time by using the control signal Ssgc which the digital filter circuit 1b receives from the microcontroller 2 via the control terminal 45 after reset cancellation.

The digital filter circuit 1b is different from the digital filter circuit 1 of the first embodiment in that the terminal 45 is additionally provided, and in that the counter 19 is provided instead of the filter time setting circuit 17.

The counter 19 is provided between the terminal 45 and the comparator 15. The counter 19 receives the control signal Ssgc at a CK port of the counter 19, and uses the control signal Ssgc as the clock of the counter. The counter 19 receives the reset signal Srst at an R port of the counter 19, and resets data on the basis of the reset signal Srst. The counter 19 performs a count operation upon receiving the control signal Ssgc inputted via the terminal 45, and outputs the count value as a signal S8.

The comparator 15 is provided among the counter 14 and the decoder 16. The comparator 15 is provided among the counter 19 and the decoder 16. The comparator 15 receives the count signal Scount and the signal S8 being the count signal. When the value of the count signal Scount matches the value of the signal S8, the comparator 15 outputs a signal Scntag of a high level (enable state). When the value of the count signal Scount does not match the value of the signal S8, the comparator 15 outputs the signal Scntag of a low level (disable state).

As described above, the digital filter circuit of the embodiment is provided with the sampling circuit 11, the EXOR circuit 12, the reset control circuit 13, the counter 14, the comparator 15, the decoder 16, the counter 19, the clock gating circuit 18, the flip-flop 24, and the terminals 41 to 45. The digital filter circuit 1b is configured to be capable of determining the arbitrary filtering time by using only the control signal Ssgc which serves as the clock inputted into the counter 19 via the terminal 45.

Accordingly, no control circuit to change the filtering time is required. Moreover, since the circuit configuration is simplified, increase in the circuit scale can be further suppressed as digital filters are required for a larger number of channels. Moreover, since the digital filter circuit 1b is operated based on the clock gating signal Sgclk, the power consumption of the digital filter circuit 1b can be suppressed.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A digital filter circuit, comprising:
  an EXOR circuit to receive an input signal and a feedback-inputted output signal, the EXOR circuit to generate a clock gating enable signal of an enable state once receiving the output signal and the input signal having a phase reverse to that of the output signal;
  a clock gating circuit to receive a clock signal and the clock gating enable signal, the clock gating circuit to capture and output the clock signal as a clock gating signal while the clock gating enable signal is in the enable state;

a reset control circuit to receive the clock signal and the clock gating enable signal, the reset control circuit to generate a first signal of the enable state once the clock gating enable signal changes from the enable state to a disable state;

a counter to receive the first signal and the clock gating signal, the counter to be synchronously reset when the first signal is in the enable state, the counter to perform a count operation to generate a count signal each time the counter receives the clock gating signal while the first signal is in the disable state;

a filter time setting circuit to receive the first signal, the clock gating signal and the count signal, the filter time setting circuit to latch the count signal when the first signal is in the enable state, the filter time setting circuit to output a latched count value as a second signal;

a comparator to receive the count signal and the second signal, the comparator to output a third signal of the enable state when the value of the count signal and the value of the second signal match each other; and a decoder to receive the feedback-inputted output signal, the first signal and the third signal, the decoder to generate a fourth signal resulting from decode processing, wherein the input signal is subjected to digital signal processing.

2. The digital filter circuit according to claim 1, further comprising a storage circuit to receive the fourth signal and the clock gating signal, the storage circuit to store information of the fourth signal on the basis of the clock gating signal, and to output the stored information as the output signal.

3. The digital filter circuit according to claim 2, wherein the storage circuit includes a flip-flop.

4. The digital filter circuit according to claim 1, wherein the clock gating circuit includes a two-input OR circuit, a latch circuit, and a two-input AND circuit, the two-input OR circuit receives the clock gating enable signal and the first signal, the two-input OR circuit performs logical operation processing, the latch circuit receives a signal outputted from the two-input OR circuit and resulting from the logical operation processing, the latch circuit latches the signal resulting from the logical operation processing at a falling edge of the clock signal, the latch circuit outputs the latched signal, and the two-input AND circuit receives the latched signal and the clock signal, the two-input AND circuit outputs a signal resulting from logical operation processing as the clock gating signal.

5. A digital filter circuit, comprising:

a sampling circuit to receive an input signal to be inputted via an input terminal and a clock signal to be inputted via a clock terminal, the sampling circuit to generate a first signal by subjecting the input signal to sampling processing on the basis of the clock signal;

an EXOR circuit to receive the first signal and a feedback-inputted output signal, the EXOR circuit to generate a clock gating enable signal of a high level once receiving the output signal and the first signal having a phase reverse to that of the output signal;

a clock gating circuit to receive the clock signal and the clock gating enable signal, the clock gating circuit to capture and output the clock signal as a clock gating signal while the clock gating enable signal is at the high level;

a reset control circuit to receive the clock signal and the clock gating enable signal, the reset control circuit to generate a second signal of the high level once the clock gating enable signal changes from the high level to a low level;

a counter to receive the second signal and the clock gating signal, the counter to be synchronously reset the when the second signal is at a high level, the counter to perform a count operation to generate a count signal each time the counter receives the clock gating signal while the second signal is at a low level;

a filter time setting circuit to receive the second signal, the clock gating signal, and the count signal, the filter time setting circuit to latch the count signal when the second signal is at the high level, the filter time setting circuit to output a latched count value as a third signal;

a comparator to receive the count signal and the third signal, the comparator to output a fourth signal of a high level when the value of the count signal and the value of the third signal match each other;

a decoder to receive the feedback-inputted output signal, the first signal and the fourth signal, the decoder to generate a fifth signal resulting from decode processing; and a storage circuit to receive the fifth signal and the clock gating signal, the storage circuit to store information of the fifth signal on the basis of the clock gating signal, the storage circuit to output the stored information as the output signal, wherein the input signal is subjected to digital signal processing.

6. The digital filter circuit according to claim 5, wherein the sampling circuit includes a plurality of flip-flops which are connected together in series.

7. The digital filter circuit according to claim 5, wherein, after reset cancellation by a reset signal inputted from a reset terminal, the reset control circuit outputs the second signal to synchronously reset the counter, once the clock gating enable signal outputted from the EXOR circuit changes from the high level to the low level, and the filter time setting circuit latches the count value of the count signal on the basis of the clock gating signal when the second signal is at the high level.

8. The digital filter circuit according to claim 7, wherein the input signal and the reset signal are generated by any one of a microcontroller, a CPU and a DSP.

9. The digital filter circuit according to claim 5, wherein the clock gating circuit includes a two-input OR circuit, a latch circuit, and a two-input AND circuit, the two-input OR circuit receives the clock gating enable signal and the second signal, the two-input OR circuit performs logical operation processing, the latch circuit receives a signal outputted from the two-input OR circuit and resulting from the logical operation processing, the latch circuit latches the signal resulting from the logical operation processing at a falling edge of the clock signal, the latch circuit outputs the latched signal, and the two-input AND circuit receives the latched signal and the clock signal, the two-input AND circuit outputs a signal resulting from logical operation processing as the clock gating signal.

10. The digital filter circuit according to claim 5, wherein the storage circuit includes a flip-flop.

11. A digital filter circuit, comprising:

a sampling circuit to receive an input signal to be inputted via an input terminal and a clock signal to be inputted via a clock terminal, the sampling circuit to generate a first signal by subjecting the input signal to sampling processing on the basis of the clock signal;

an EXOR circuit to receive the first signal and a feedback-inputted output signal, the EXOR circuit to generate a clock gating enable signal of a high level once receiving the output signal and the first signal having a phase reverse to that of the output signal, a clock gating circuit to receive the clock signal and the clock gating enable signal, the clock gating circuit to capture and output the clock signal as a clock gating signal while the clock gating enable signal is at the high level;

a reset control circuit to receive the clock signal and the clock gating enable signal, the reset control circuit to generate a second signal of a high level once the clock gating enable signal changes from the high level to a low level;

a first counter to receive the second signal and the clock gating signal, the first counter to be synchronously reset when the second signal is at the high level, the first counter to perform a count operation to generate a first count signal each time the first counter receives the clock gating signal while the second signal is at the low level;

a second counter to receive a control signal to be inputted via a control terminal, the second counter to perform a count operation to generate a second count signal once receiving the control signal;

a comparator to receive the first and second count signals, the comparator to output a third signal of the high level when the value of the first count signal and the value of the second signal match each other;

a decoder to receive the feedback-inputted output signal, the first signal and the third signal, the decoder to generate a fourth signal resulting from decode processing; and a storage circuit to receive the fourth signal and the clock gating signal, the storage circuit to store information of the fourth signal on the basis of the clock gating signal, the storage circuit to output the stored information as the output signal, wherein the input signal is subjected to digital signal processing.

12. The digital filter circuit according to claim 11, wherein the input signal is outputted from a signal generation source to convert an analog signal to a digital signal.

13. The digital filter circuit according to claim 11, wherein the control signal is generated by any one of a microcontroller, a CPU and a DSP.

14. The digital filter circuit according to claim 11, wherein the clock gating circuit includes a two-input OR circuit, a latch circuit, and a two-input AND circuit, the two-input OR circuit receives the clock gating enable signal and the second signal, the two-input OR circuit performs logical operation processing, the latch circuit receives a signal outputted from the two-input OR circuit and resulting from the logical operation processing, the latch circuit latches the signal resulting from the logical operation processing at a falling edge of the clock signal, the latch circuit outputs the latched signal, and the two-input AND circuit receives the latched signal and the clock signal, the two-input AND circuit outputs a signal resulting from logical operation processing as the clock gating signal.

15. The digital filter circuit according to claim 11, wherein the sampling circuit includes a plurality of flip-flops which are connected together in series.

16. The digital filter circuit according to claim 11, wherein the storage circuit includes a flip-flop.

* * * * *